(12) United States Patent
Takeda et al.

(10) Patent No.: US 11,101,150 B2
(45) Date of Patent: Aug. 24, 2021

(54) WAFER GRINDING APPARATUS AND WAFER GRINDING METHOD

(71) Applicant: Mitsubishi Electric Corporation, Tokyo (JP)

(72) Inventors: Naoyuki Takeda, Tokyo (JP); Kazunari Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/372,701

(22) Filed: Apr. 2, 2019

(65) Prior Publication Data

US 2019/0355596 A1    Nov. 21, 2019

(30) Foreign Application Priority Data

May 17, 2018    (JP) .............................. JP2018-095262

(51) Int. Cl.
| | | |
|---|---|---|
| *H01L 21/67* | (2006.01) | |
| *B24B 7/22* | (2006.01) | |
| *H01L 21/463* | (2006.01) | |
| *H01L 21/304* | (2006.01) | |
| *B24B 37/11* | (2012.01) | |
| *B24B 37/10* | (2012.01) | |
| *B24B 37/34* | (2012.01) | |

(52) U.S. Cl.
CPC ........ *H01L 21/67092* (2013.01); *B24B 7/228* (2013.01); *B24B 37/10* (2013.01); *B24B 37/11* (2013.01); *B24B 37/34* (2013.01); *H01L 21/304* (2013.01); *H01L 21/463* (2013.01); *H01L 21/67219* (2013.01); *H01L 21/67288* (2013.01)

(58) Field of Classification Search
CPC ..... B24B 7/228; H01L 21/463; H01L 21/304; H01L 21/67092
See application file for complete search history.

(56) References Cited

U.S. PATENT DOCUMENTS

| | | | | |
|---|---|---|---|---|
| 2011/0294233 | A1* | 12/2011 | Nakata | .................... H01L 22/20 438/7 |
| 2015/0258657 | A1* | 9/2015 | Su | ........................... B24B 49/12 451/6 |
| 2017/0053819 | A1* | 2/2017 | Richardson | ......... H01J 37/3244 |

FOREIGN PATENT DOCUMENTS

| | | | |
|---|---|---|---|
| JP | H08-197377 | A | 8/1996 |
| JP | 2006-255851 | A | 9/2006 |
| JP | 2007-229848 | A | 9/2007 |
| JP | 2011036962 | * | 2/2011 |
| JP | 2011-143516 | A | 7/2011 |
| JP | 2011-189411 | A | 9/2011 |

OTHER PUBLICATIONS

JP 2011036962 (Year: 2011).*

(Continued)

*Primary Examiner* — Ahmed N Sefer
(74) *Attorney, Agent, or Firm* — Studebaker & Brackett PC (57) ABSTRACT

A wafer grinding apparatus performs grinding processing for grinding a semiconductor wafer with a grindstone. The grindstone has a wear rate as a characteristic. The wear rate is 5% or more, and less than 200%. A determination part performs determination processing for determining whether a grinding state with respect to the semiconductor wafer is abnormal or normal, based on at least one of a load current of a motor and a grinding wear amount.

4 Claims, 7 Drawing Sheets

(56) References Cited

OTHER PUBLICATIONS

An Office Action; "Notice of Reasons for Refusal," mailed by the Japanese Patent Office dated May 25, 2021, which corresponds to Japanese Patent Application No. 2018-095262 and is related to U.S. Appl. No. 16/372,701; with English language translation.

* cited by examiner

WAFER GRINDING APPARATUS AND WAFER GRINDING METHOD

BACKGROUND OF THE INVENTION

Field of the Invention

The present invention relates to a wafer grinding apparatus that grinds a semiconductor wafer, and a wafer grinding method.

Description of the Background Art

Grinding processing (grinding machining) is performed to thin a semiconductor wafer (hereinafter, also referred to as a "wafer") into a thin plate. In the grinding processing, a water placed on a grinding table is ground with a rotating grindstone for grinding (hereinafter, also referred to as a "grindstone"). In a period when the grinding processing is performed, abnormality (hereinafter, also referred to as "wafer abnormality") may occur in the wafer. The wafer abnormality is, for example, breaking, cracking, or the like.

In Japanese Patent Application Laid-Open Nos. 2011-143516, 2011-189411, a configuration for detecting wafer abnormality (hereinafter, also referred to as a "related configuration A") is disclosed. In the related configuration A, a grinding apparatus measures a load current value of a motor that drives a spindle, and causes a storage part to store the load current value. In the storage part, a normal predetermined load current value (normal range current value) when machining of the wafer is normally performed is stored.

Occurrence of the wafer abnormality is detected by comparing the load current value during the machining of the wafer with the predetermined load current value. For example, when a state where the load current value during the machining is a value other than the predetermined load current value (normal range current value) continues for a predetermined time or longer, it is determined that wafer abnormality has occurred. Hereinafter, a state of grinding with respect to a semiconductor wafer is also referred to as a "grinding state".

In order to reduce a cost of grinding of a semiconductor wafer, in a configuration in which grinding processing is performed, high-accuracy determination as to whether a grinding state with respect to the semiconductor wafer is abnormal or normal is required.

SUMMARY

An object of the present invention is to provide a wafer grinding apparatus or the like capable of determining with high accuracy whether a grinding state with respect to a semiconductor wafer is abnormal or normal.

A wafer grinding apparatus according to one aspect of the present invention performs grinding processing for grinding a semiconductor wafer with a grindstone. In the grinding processing, when a grinding amount is expressed as Kw, and a wear amount of the grindstone is expressed as Kt, the grinding amount being an amount for grinding the semiconductor wafer with the grindstone, and the wear amount being planned to be generated by performing the grinding processing, the grindstone has, as a characteristic, a wear rate expressed by a formula of Kt/Kw, the wear rate is 5% or more, and less than 200%, and the wafer grinding apparatus includes a determination part that performs determination processing for determining whether a grinding state with respect to the semiconductor wafer is abnormal or normal, based on at least one of (a) a load current of a motor for rotating the grindstone in the grinding processing, and (b) a grinding wear amount that is a wear amount of the grindstone generated by performing the grinding processing.

Hereinafter, the wear rate of 5% or more, and less than 200% is referred to as a "special wear rate". Hereinafter, the wear rate less than 5% is also referred to as a "general wear rate". In the following description, the grindstone having the special wear rate is also referred to as a "special grindstone". Hereinafter, the grindstone having the general wear rate is also referred to as a "general grindstone".

According to the present invention, the wafer grinding apparatus performs the grinding processing for grinding the semiconductor wafer with the grindstone. The grindstone has a wear rate as a characteristic. The wear rate is 5% or more, and less than 200%. That is, in the grinding processing performed by the wafer grinding apparatus, the special grindstone having the special wear rate is used. The determination part performs the determination processing for determining whether the grinding state with respect to the semiconductor wafer is abnormal or normal, based on at least one of the load current of the motor and the grinding wear amount.

From the experiment, the inventors of the present invention have confirmed that in the configuration using the special grindstone in the grinding processing, based on the load current, the grinding wear amount, or the like, it can be determined with higher accuracy whether the grinding state with respect to the semiconductor wafer (the wafer grinding state) is abnormal or normal, as compared with the configuration using the general grindstone in the grinding processing.

As a result, in the present configuration in which the special grindstone is used in the grinding processing performed by the wafer grinding apparatus, it is possible to determine with high accuracy whether the grinding state with respect to the semiconductor wafer is abnormal or normal.

These and other objects, features, aspects and advantages of the present invention will become more apparent from the following detailed description of the present invention when taken in conjunction with the accompanying drawings.

DESCRIPTION OF THE PREFERRED EMBODIMENT

Hereinafter, a preferred embodiment will be described with reference to the drawings. In the following drawings, the same components are denoted by the same reference numerals. Names and functions of the components denoted by the same reference numeral are the same. Therefore, a detailed description of a part of each of the components denoted by the same reference numeral may be omitted.

It should be noted that dimensions, materials, shapes, relative positions of components, and the like exemplified in the preferred embodiment may be appropriately changed according to a configuration of an apparatus to which the present invention is applied, various conditions, and the like. Moreover, the dimensions of each of the components in each of the drawings may be different from an actual size.

First Preferred Embodiment

Figure 1:
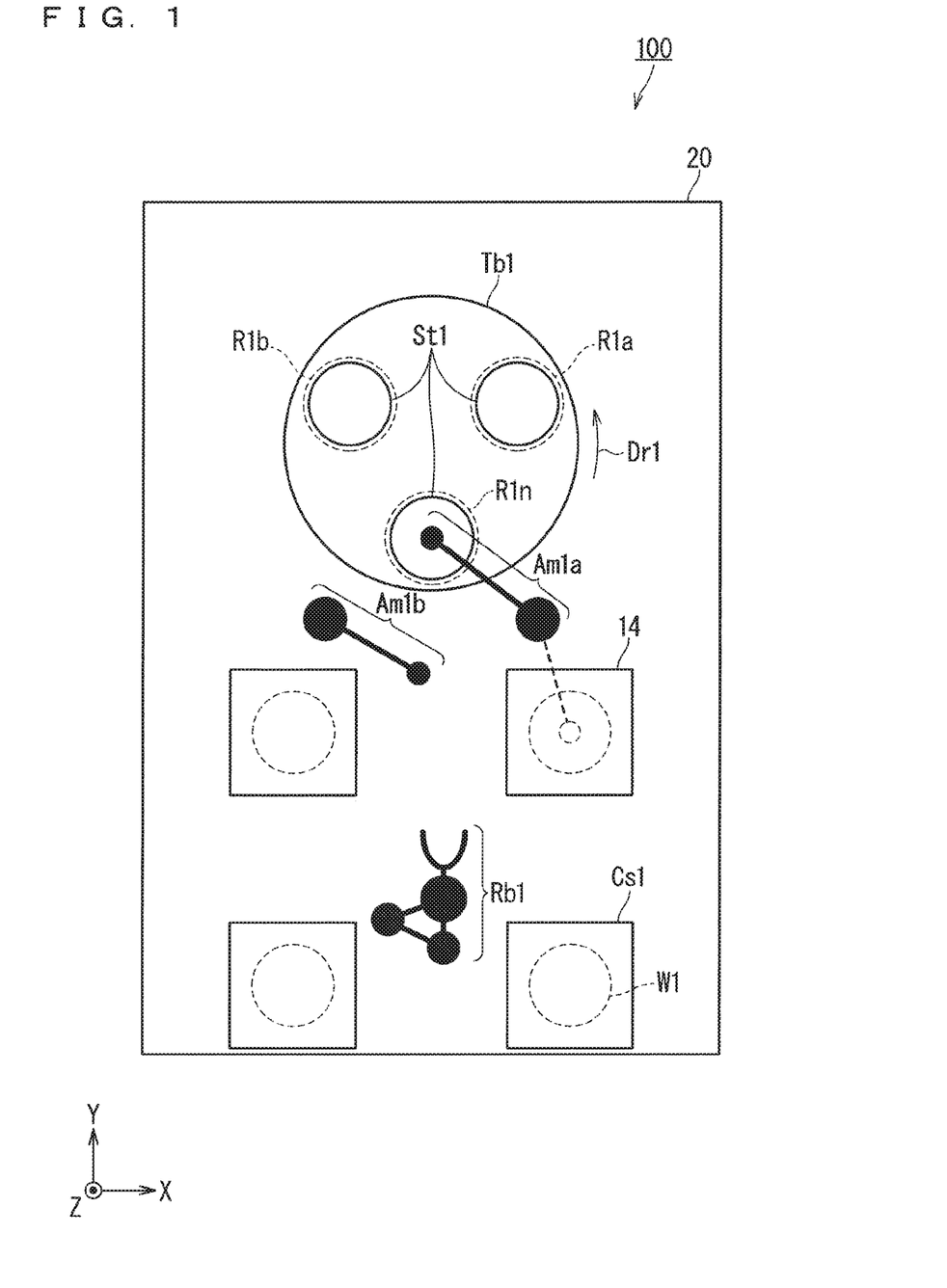
FIG. 1 is a top view of a wafer grinding apparatus according to a first preferred embodiment.

FIG. 1 is a top view of a wafer grinding apparatus 100 according to a first preferred embodiment. In FIG. 1, a grinding unit 10 described later is not shown in order to make a configuration easy to understand.

In FIG. 1, an X direction, a Y direction, and a Z direction are orthogonal to one another. The X direction, the Y direction, and the Z direction shown in the following figures are also orthogonal to one another. Hereinafter, a direction including the X direction and a direction opposite to the X direction (−X direction) is also referred to as an "X axis direction". In the following description, a direction including the Y direction and a direction opposite to the Y direction (−Y direction) is also referred to as a "Y axis direction". In the following description, a direction including the Z direction and a direction opposite to the Z direction (−Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

Figure 2:
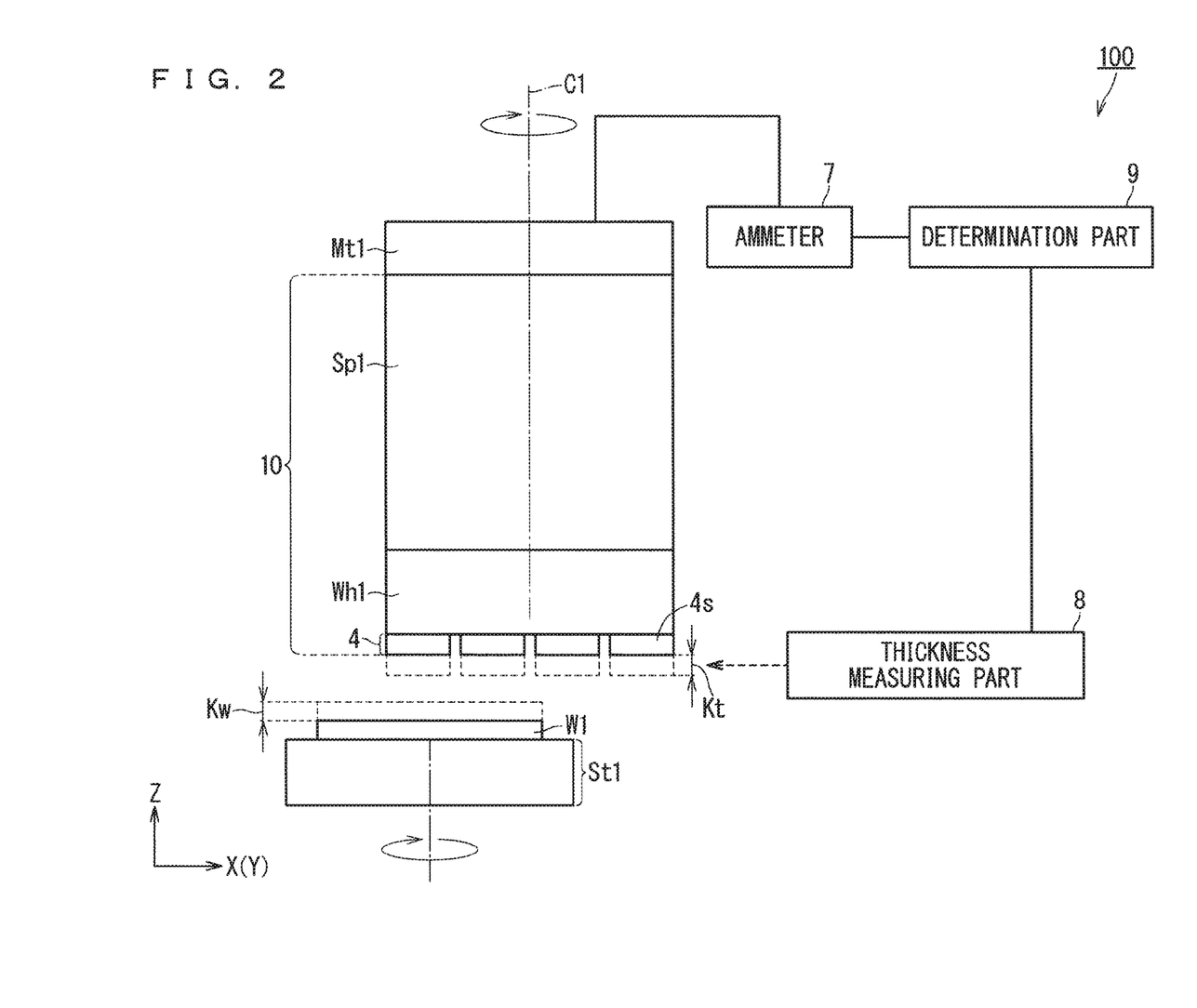
FIG. 2 is a diagram showing a configuration of the wafer grinding apparatus according to the first preferred embodiment.

FIG. 2 is a diagram showing a configuration of the wafer grinding apparatus 100 according to the first preferred embodiment. The wafer grinding apparatus 100 has a function of grinding a semiconductor wafer W1. FIG. 2 mainly shows a configuration for grinding the semiconductor wafer W1 in the wafer grinding apparatus 100.

A shape of the semiconductor wafer W1 is disk-shaped. The semiconductor wafer W1 is a substrate made of SiC. The semiconductor wafer W1 may be made of a material other than SiC. The semiconductor wafer W1 may be made of, for example, Si, $Al_2O_3$, GaN, or the like.

Referring to FIGS. 1 and 2, the wafer grinding apparatus 100 includes a housing 20, a turn table Tb1, a wafer cassette Cs1, three stages St1, a conveyance robot Rb1, an alignment mechanism 14, conveyance arms Am1a, Am1b, the grinding unit 10, a motor Mt1, an ammeter 7, a determination part 9, and a thickness measuring part 8.

Each of components other than the housing 20 shown in FIG. 1 is provided on the housing 20. The wafer cassette Cs1 accommodates the semiconductor wafer W1. The turn table Tb1 is provided on the housing 20. The turn table Tb1 is configured rotatably. On the turn table Tb1, the three stages St1 are provided.

FIG. 1 shows a state where the three stages St1 exist in regions R1n, R1a, and R1b, respectively. The stage St1 existing in the region R1n functions as a transfer part for transferring the semiconductor wafer W1.

Each of the stages St1 is configured rotably. Each of the stages St1 has a function of holding the semiconductor wafer W1 by suction.

The conveyance robot Rb1 has a function of conveying the semiconductor wafer W1. Each of the conveyance arms Am1a, Am1b has a function of conveying the semiconductor wafer W1.

The grinding unit 10 is a member for grinding the semiconductor wafer W1. The grinding unit 10 is configured rotatably with an axis C1 as a rotation axis. The motor Mt1 is a motor for rotating the grinding unit 10. The motor Mt1 is driven by power (voltage) being supplied from a power source (not shown) to the motor Mt1. A current (hereinafter, also referred to as a "load current") is generated in the motor Mt1 being driven. In a period when the motor Mt1 is rotating the grinding unit 10, the load current is generated in the motor Mt1. Hereinafter, a value of the load current is also referred to as a "load current value".

The ammeter 7 has a function of measuring the load current value at any time. Each time the load current value is measured, the ammeter 7 notifies the determination part 9 of the measured load current value. As a result, the determination part 9 always grasps the load current value. The determination part 9 will be described later.

The grinding unit 10 includes a spindle Sp1, a wheel Wh1, and a grindstone 4. A shape of the spindle Sp1 is cylindrical. The wheel Wh1 is coupled to a lower end of the spindle Sp1. The grindstone 4 is fixed to the wheel Wh1. That is, the motor Mt1 for rotating the grinding unit 10 is also a motor for rotating the grindstone 4.

Figure 3:
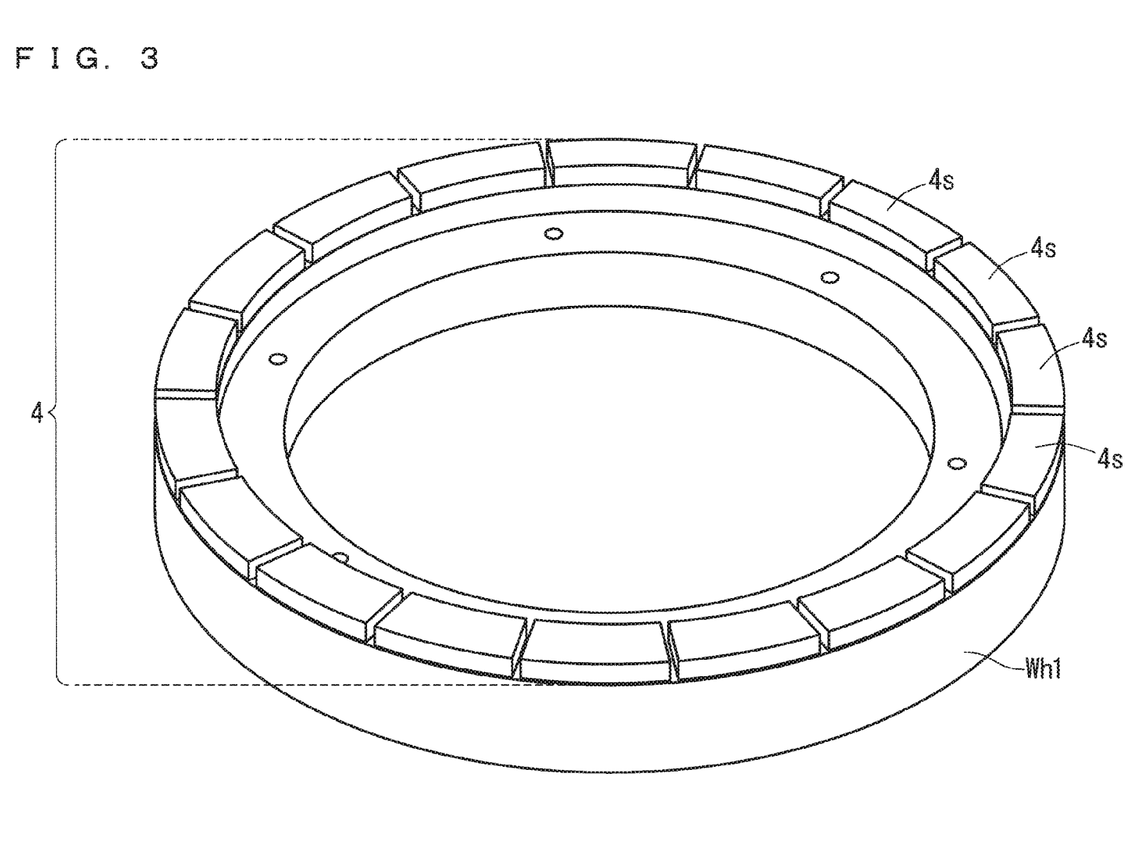
FIG. 3 is a perspective view mainly showing a configuration of a grindstone.

FIG. 3 is a perspective view mainly showing a configuration of the grindstone 4. The grindstone 4 includes a plurality of grindstones 4s. The plurality of grindstones 4s are fixed to the wheel Wh1. In the wheel Wh1, the plurality of grindstones 4s are arranged in a ring shape. The grindstone 4 may be configured of, for example, one ring-shaped grindstone 4s.

The grindstone 4 is configured of a plurality of abrasive grains and a bond material. The abrasive grains are made of, for example, diamond. The bond material is, for example, configured of vitrified (sintered ceramics). Specifically, the grindstone 4 is configured by mixing a plurality types of abrasive grains in the bond material. Note that a plurality of pores also exist in the bond material.

In the following description, processing for grinding the semiconductor wafer W1 with the grindstone 4 is also referred to as "grinding processing". The wafer grinding apparatus 100 performs the grinding processing. The grinding processing is performed in a state where the semiconductor wafer W1 (stages St1) and the grindstone 4 are rotating. In the grinding processing, the motor Mt1 rotates the grindstone 4 (the grinding unit 10).

Hereinafter, a surface of the grindstone 4 used for the grinding processing is also referred to as a "grinding use surface". The grinding use surface corresponds to an upper surface of the grindstone 4 (grindstone 4s) in FIG. 3.

Hereinafter, a period when the grinding processing is being performed is also referred to as a "grinding period Pd". In the following description, a state of the grinding with respect to the semiconductor wafer W1 is also referred to as a "grinding state". In the following description, the grinding state with respect to the semiconductor wafer W1 in the grinding period Pd is also referred to as a "wafer grinding state".

The determination part 9 determines whether the semiconductor wafer W1 is normally ground by the grinding processing. Specifically, the determination part 9 performs determination processing for determining whether the wafer grinding state is abnormal or normal, based on the load current (load current value).

Hereinafter, the abnormality in the case where the wafer grinding state is abnormal is also referred to as "grinding abnormality". The grinding abnormality is a situation where the semiconductor wafer W1 is not normally ground. Moreover, in the following description, a time for determining the grinding abnormality is also referred to as a "unit time". The unit time is, for example, 0.1 seconds.

In the following description, a threshold value for determining the grinding abnormality is also referred to as an "abnormality determination threshold value". The abnormality determination threshold value is a value corresponding to k times the load current value immediately before occurrence of the wafer abnormality. The wafer abnormality is, for example, breaking, cracking and the like. The "k" is a positive real number less than 1. The "k" is a value included, for example, in a range of 0.2 to 0.5.

In the grinding period Pd, when a change amount in the load current (load current value) in the unit time is equal to or larger than the abnormality determination threshold value, the determination part 9 determines that the wafer grinding state is abnormal (that is, the wafer abnormality has occurred). The parameter for determining the wafer grinding state is not limited to the change amount of the load current value in the unit time, and other parameters may be used.

Hereinafter, a surface of the semiconductor wafer W1 to be ground is also referred to as a "grinding surface". The grinding surface is a back surface of the semiconductor wafer W1. The wafer abnormality is mainly abnormality occurring on the grinding surface.

In the grinding processing, the grinding use surface of the rotating grindstone 4 is brought into contact with the grinding surface of the rotating semiconductor wafer W1, whereby the grinding surface is ground. In the following description, in the grinding processing, an amount for grinding the semiconductor wafer W1 with the grindstone 4 is expressed as a "grinding amount Kw" or "Kw". The grinding amount Kw is a grinding amount planned to be ground with the grindstone 4 with respect to the semiconductor wafer W1 in one grinding processing.

In the following description, the grinding processing in the case where no wafer abnormality occurs in the period when the grinding processing is being performed is also referred to as "normal grinding processing". In the following description, the grinding processing in the case where wafer abnormality occurs in the period when the grinding processing is being performed is also referred to as "abnormality occurrence grinding processing".

In the following description, a wear amount of the grindstone 4 planned to be generated by performing the normal grinding processing is expressed as a "wear amount Kt" or "Kt". The wear amount Kt is a wear amount of the grindstone 4 generated when the normal grinding processing is performed once.

FIG. 2 shows, as one example, the grinding amount Kw and the wear amount Kt generated by performing the normal grinding processing once. The grinding amount Kw corresponds to a value (hereinafter, also referred to as a "grinding thickness") obtained by subtracting a thickness of the semiconductor wafer W1 immediately after the normal grinding processing is performed from the thickness of the semiconductor wafer W1 immediately before the normal grinding processing is performed. The grinding amount Kw is not limited to the grinding thickness. The grinding amount Kw may be a value obtained by multiplying the grinding thickness by a total area of the grinding surface of the semiconductor wafer W1.

The wear amount Kt corresponds to a value (hereinafter, also referred to as a "wear thickness") obtained by subtracting the thickness of the grindstone 4 immediately after the normal grinding processing is performed from the thickness of the grindstone 4 immediately before the normal grinding processing is performed. The wear amount Kt is not limited to the wear thickness. The wear amount Kt may be a value obtained by multiplying the wear thickness by a total area of the grinding use surface of the grindstone 4.

The grindstone 4 has a wear rate as a characteristic (attribute). The wear rate is a value obtained by dividing the wear amount Kt by the grinding amount Kw. That is, the wear rate is expressed by a formula of Kt/Kw. The smaller the wear rate is, the larger a hardness of the grindstone 4 is. That is, the smaller the wear rate is, the harder the grindstone 4 is to wear out. The larger the wear rate is, the smaller the hardness of the grindstone 4 is. That is, the larger the wear rate is, the easier the grindstone 4 is to wear out.

The wear rate of the grindstone 4 used in the present preferred embodiment is 5% or more, and less than 200%. Hereinafter, the wear rate of 5% or more, and less than 200% is referred to as a "special wear rate". That is, the grindstone 4 has the special wear rate.

In the following description, a thickness of the grindstone 4 is also referred to as a "grindstone thickness". The thickness measuring part 8 has a function of measuring the grindstone thickness at any time. Moreover, each time the grindstone thickness is measured, the thickness measuring part 8 notifies the determination part 9 of the measured grindstone thickness. This allows the determination part 9 to always grasp the grindstone thickness.

Next, operation of the wafer grinding apparatus 100 will be described. Referring to FIG. 1, the conveyance robot Rb1 conveys the semiconductor wafer W1 accommodated in the wafer cassette Cs1 to the alignment mechanism 14.

Thereafter, for example, a position of an outer circumference of the semiconductor wafer W1 is measured, whereby a center of the semiconductor wafer W1 is found. The conveyance arm Am1a conveys the semiconductor wafer W1 so that the center of the semiconductor wafer W1 coincides with a center of the stage St1 inside the region R1n, and places the semiconductor wafer W1 on the stage St1 inside the region R1n. This allows the stage St1 inside the region R1n to hold the semiconductor wafer W1. Hereinafter, a state of the stage St1 in the situation where the stage St1 holds the semiconductor wafer W1 is also referred to as a "holding state".

Next, the turn table Tb1 rotates in a counterclockwise direction Dr1 so that the stage St1 in the holding state moves to the region R1a.

In the stage St1 inside the region R1a, the first grinding processing is performed. The first grinding processing is processing for changing the thickness of the semiconductor wafer W1 to a predetermined thickness. Next, the turn table Tb1 rotates in the counterclockwise direction Dr1 so that the stage St1 in the holding state moves to the region R1b. In the stage St1 inside the region R1b, the second grinding processing is performed. In the second grinding processing, processing for grinding the semiconductor wafer W1 by a predetermined grinding amount is performed.

Figure 4A:
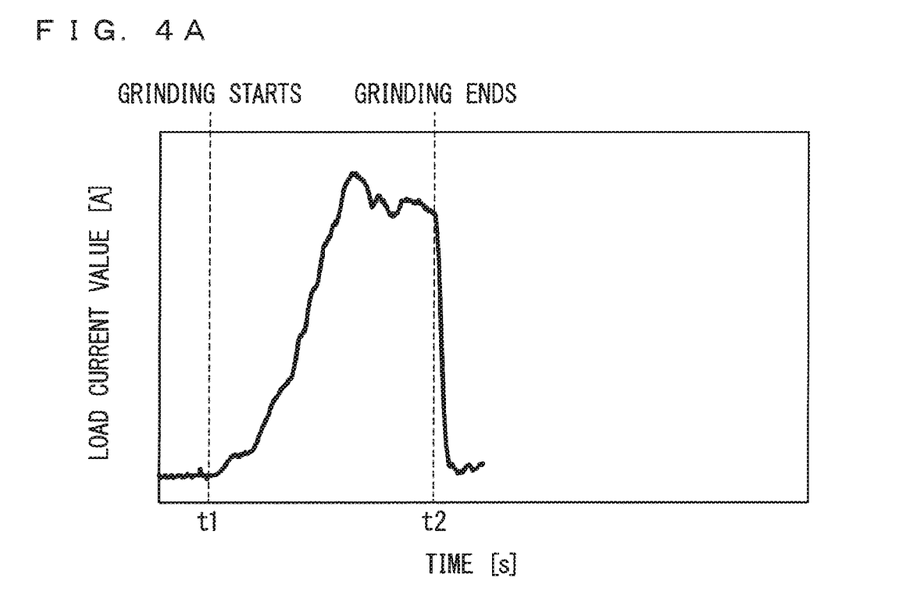
FIGS. 4A and 4B are diagrams each showing an example of a measurement result of a load current value when a special grindstone is used.
Figure 4B:
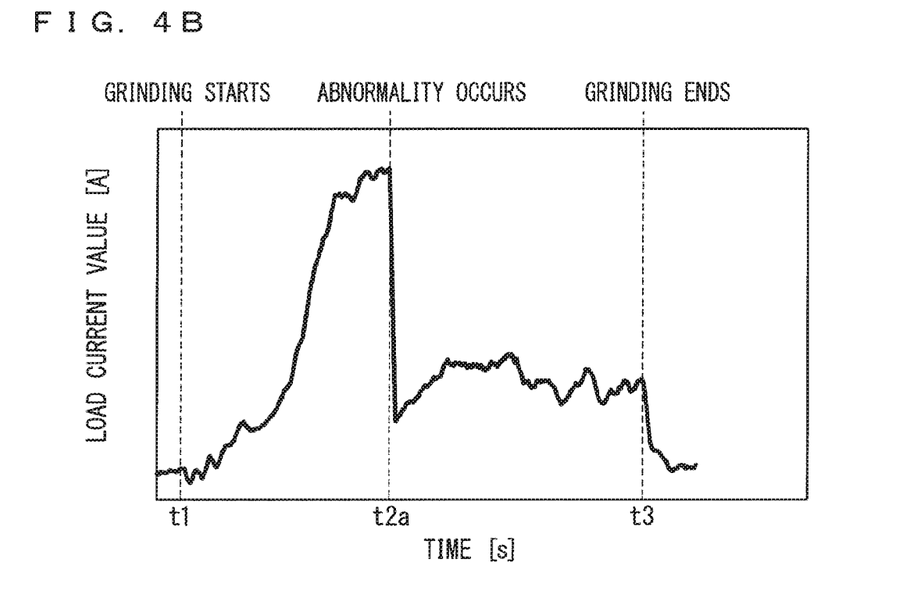

Next, a measurement result of the load current value will be described. In the following description, the grindstone 4 having the special wear rate is also referred to as a "special grindstone". FIGS. 4A and 4B are diagrams each showing an example of the measurement result of the load current value when the special grindstone is used. FIG. 4A is a diagram showing the measurement result of the load current value in the case where the normal grinding processing is performed, using the special grindstone. FIG. 4B is a diagram showing the measurement result of the load current value in the case where the abnormality occurrence grinding processing is performed, using the special grindstone. FIG. 4B shows the measurement result of the load current value when the wafer abnormality occurs on the grinding surface of the semiconductor wafer W1 at a time t2a.

FIG. 4A shows that the normal grinding processing started at a time t1 and that the normal grinding processing ends at a time t2. FIG. 4B shows that abnormality occurrence grinding processing is started at the time t1 and that the abnormality occurrence grinding processing ends at a time t3. In FIG. 4A, no large fluctuation of the load current value occurs in a period from the start to the end of the normal grinding processing.

On the other hand, in FIG. 4B, the wafer abnormality occurs on the grinding surface at the time t2a, and large fluctuation of the load current value occurs. This is because when the wafer abnormality occurs, the state of the grinding surface is different from the state of the grinding surface at normal time.

Here, it is assumed that the wafer abnormality is wafer breaking. The wafer breaking is, for example, breaking (a crack) existing on the grinding surface. When the wafer breaking occurs, a step is generated at a position where the wafer breaking occurs. That is, the state of the grinding surface of the semiconductor wafer W1 changes. As a result, a manner in which the grindstone 4 bites (meshes with) the grinding surface changes. Therefore, a state of the grindstone 4 changes largely, and the load current value largely fluctuates (decreases).

Figure 5:
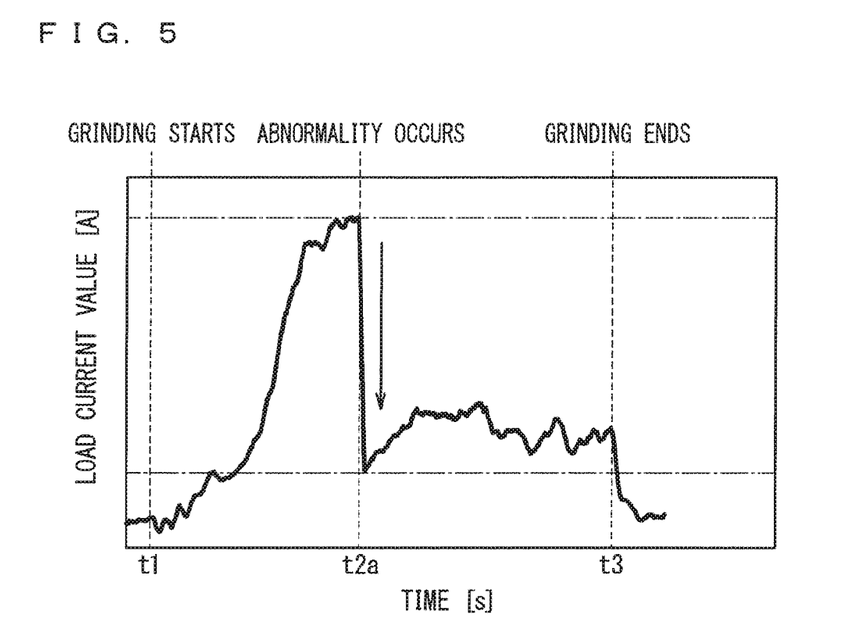
FIG. 5 is a diagram showing large change in the load current value.

Here, in the grinding period Pd, it is assumed that the change amount in the load current value in the unit time immediately after the time t2a is equal to or larger than the abnormality determination threshold value. For example, as shown in FIG. 5, it is assumed that a maximum load current value at the time t2a has decreased by 0.3 times or more of the maximum load current value in the unit time.

In this ease, the determination part 9 determines that the wafer grinding state is abnormal. That is, the determination part 9 determines that the wafer abnormality has occurred. When it is determined that the wafer abnormality has occurred, the operation of the wafer grinding apparatus 100 is stopped.

Next, a comparative example to be compared with the present preferred embodiment will be described. Hereinafter, a wafer grinding apparatus in the comparative example is also referred to as a "wafer grinding apparatus C1". The wafer grinding apparatus C1 is different from the wafer grinding apparatus 100 in that a grindstone 4N is included instead of the grindstone 4. Since other configurations and functions of the wafer grinding apparatus C1 are similar to those of the wafer grinding apparatus 100, detailed description thereof will not be repeated.

Hereinafter, the wear rate less than 5% is also referred to as a "general wear rate". The grindstone 4N is different from the grindstone 4 in that the grindstone 4N has the general wear rate instead of the special wear rate. Since the other components and functions of the grindstone 4N are similar to those of the grindstone 4, detailed description thereof will not be repeated. The wafer grinding apparatus C1 is an apparatus in which the grindstone 4 is replaced with the grindstone 4N in the wafer grinding apparatus 100 in FIG. 2.

Figure 8A:
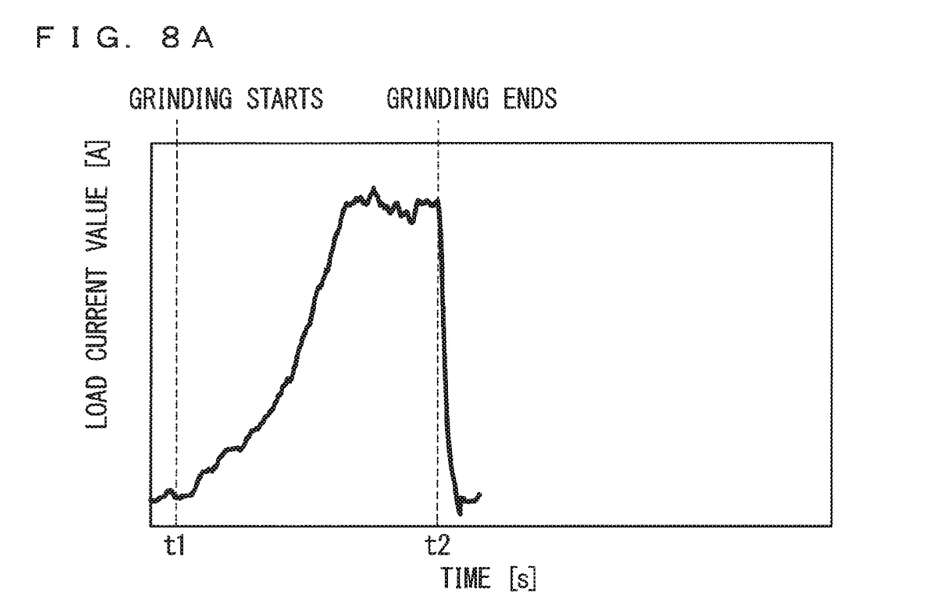
FIGS. 8A and 8B are diagrams each showing an example of the measurement result of the load current in a case where a general grindstone is used.
Figure 8B:
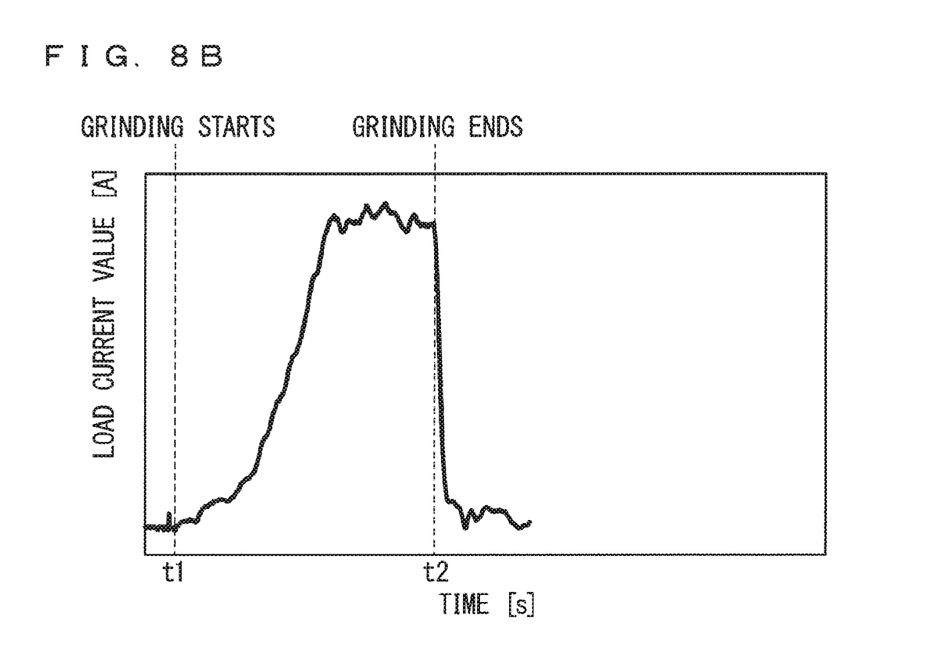

Next, a measurement result of the load current value will be described. Hereinafter, the grindstone 4N having the general wear rate is also referred to as a "general grindstone". FIGS. 8A and 8B are diagrams each showing an example of the measurement result of the load current value in the case where the general grindstone is used. FIG. 8A is a diagram showing the measurement result of the load current value in the case where the normal grinding processing is performed by the wafer grinding apparatus C1, using the general grindstone. FIG. 8B is a diagram showing an example of the measurement result of the load current value in the case where the abnormality occurrence grinding processing is performed, using the general grindstone.

As an experiment, the inventors of the present invention repeatedly performed the grinding processing using the general grindstone. The inventors of the present invention have confirmed that in the grinding processing using the general grindstone, even if the wafer abnormality occurs, as shown in FIG. 8B, in many cases, large change in the load current value does not occur in the grinding period Pd. That is, the inventors of the present invention have confirmed that in the grinding processing using the general grindstone, a probability of detecting wafer abnormality is low.

The wafer abnormality is, for example, breaking of the grinding surface, chipping at an end portion of the grinding surface, or the like. A width of the breaking is, for example, 10 μM or more. A length of the breaking is, for example, 0.2 mm or more. A shape of the breaking is a straight line, a curve, or the like. An occurrence position of the breaking is a center, the end portion, or the like of the grinding surface. An area of chipping is, tier example, 100 μm² or more.

The inventors of the present invention have confirmed the following phenomena in a situation where the general grindstone is used in the grinding processing. The phenomena are as follows. In the grinding processing, when a general grindstone is used, the wear amount of the general grindstone is small. Therefore, even if the state of the grinding surface of the semiconductor wafer W1 changes due to occurrence of the wafer abnormality, in many cases, the manner in which the general grindstone bites (meshes with) the grinding surface does not change. In the case where the manner in which the general grindstone bites the grinding surface dries not change, the state of the general grindstone does not change and large change in the load current value does not occur.

Moreover, the inventors of the present invention conducted an experiment to find a detection rate of the wafer abnormality (hereinafter referred to as an "experiment J1"), using a plurality of types of general grindstones each having a general wear rate and a plurality of types of special grindstones each having a special wear rate. Each of the plurality of types of general grindstones used in the experiment J1 has a different wear rate. Also, each of the plurality types of special grindstones used in the experiment J1 has a different wear rate.

In the following description, the wear amount of the grindstone (the grindstone 4 or the grindstone 4N) that is generated by performing the grinding processing once is also called a "grinding wear amount". In the experiment J1, the load current value, the grinding wear amount and the like were used as parameters for detecting the wafer abnormality.

In a configuration using the load current value, as described before, based on the change amount in the load current value, it is determined that the wafer abnormality has occurred. Further, in a configuration using the grinding wear amount, when the grinding wear amount is larger than a predetermined normal range wear value as in a first modification described later, it is determined that the wafer abnormality has occurred.

Figure 6:
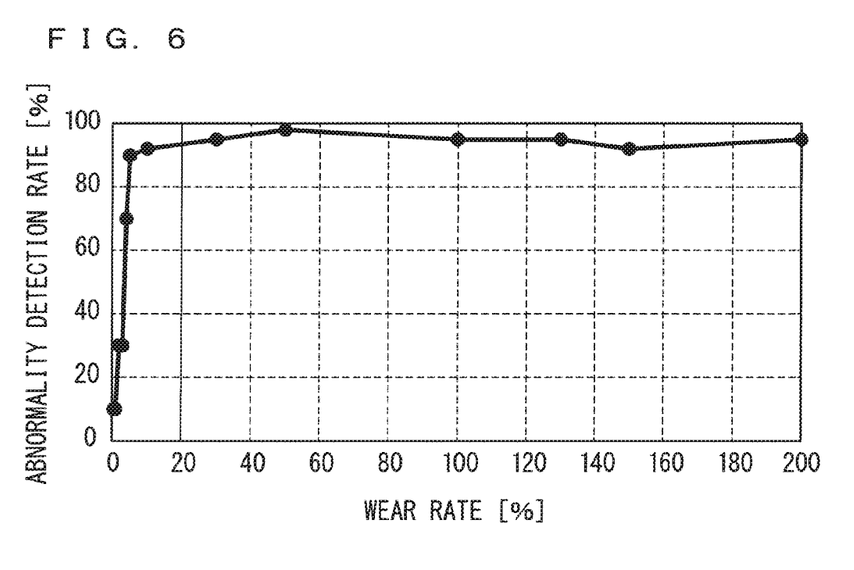
FIG. 6 is a diagram showing a result of an experiment.

FIG. 6 is a diagram showing a result of the experiment J1. In FIG. 6, an "abnormality detection rate" on a vertical axis is a probability of the detection of the wafer abnormality. The "wear rate" on a horizontal axis is a wear rate of the grindstone used in the experiment J1.

From the result in FIG. 6, the inventors of the present invention have confirmed that the configuration using the special grindstone in the abnormality occurrence grinding processing is a configuration capable of detecting the wafer abnormality at a very high probability (90% or more). Further, the inventors of the present invention have confirmed that in the configuration using the general grindstone in the abnormality occurrence grinding processing, a probability that the wafer abnormality can be detected is lower than that in the configuration using the special grindstone in the abnormality occurrence grinding processing.

That is, the inventors of the present invention have confirmed that in the configuration using the special grindstone in the abnormality occurrence grinding processing, a possibility that the state of the grindstone (special grindstone) largely fluctuates is higher than that in the configuration using the general grindstone in the abnormality occurrence grinding processing. For example, the inventors of the present invention have confirmed that in the configuration using the special grindstone in the abnormality occurrence grinding processing, a probability that large change in the load current value occurs is higher than that in the configuration using the general grindstone in the abnormality occurrence grinding processing. Further, for example, the inventors of the present invention have confirmed that in the configuration using the special grindstone in the abnormality occurrence grinding processing, a probability that the wear amount (grinding wear amount) of the grindstone (special grindstone) largely increases, as compared with the configuration using the general grindstone in the abnormality occurrence grinding processing.

Therefore, from the experiment, the inventors of the present invention have confirmed that in the configuration using the special grindstone in the grinding processing, based on the load current, the grinding wear amount, or the like, it can be determined with higher accuracy whether the wafer grinding state is abnormal or normal, as compared with the configuration using the general grindstone in the grinding processing.

As described above, according to the present preferred embodiment, the wafer grinding apparatus 100 performs the grinding processing for grinding the semiconductor wafer W1 with the grindstone 4. The grindstone 4 has a wear rate as a characteristic. The wear rate is 5% or more, and less than 200%. That is, in the grinding processing performed by the wafer grinding apparatus 100, the special grindstone having the special wear rate is used. The determination part 9 performs the determination processing for determining whether the grinding state with respect to the semiconductor wafer W1 is abnormal or normal, based on at least one of the load current of the motor Mt1 and the grinding wear amount.

As a result, in the present configuration in which the special grindstone is used in the grinding processing performed by the wafer grinding apparatus 100, it can be determined with high accuracy whether the grinding state with respect to the semiconductor wafer W1 is abnormal or normal. That is, the wafer abnormality can be detected with a very high probability.

When the wafer abnormality is detected, taking countermeasures such that the wafer abnormality does not occur can prevent the wafer abnormality from occurring on subsequent semiconductor wafers W1. Further, detecting the wafer abnormality can prevent the semiconductor wafer W1 having the wafer abnormality from being used in subsequent processes.

In the grinding processing, in order to reduce a cost of the grinding of the semiconductor wafer, generally, a grindstone having a small wear rate, that is, a general grindstone is used. According to the experiment conducted by the inventors of the present invention, in the configuration using the general grindstone, the fluctuation of the load current value is small even if the wafer abnormality such as wafer breaking and the like occurs. This makes it very difficult to distinguish between the fluctuation of the load current value associated with the occurrence of the wafer abnormality, and variation of the load current value in each wafer. Accordingly, the fluctuation of the load current value associated with the occurrence of the wafer abnormality is regarded as a normal range current value, so that in many cases, the wafer abnormality is not detected. That is, in the configuration using the general grindstone, the probability that the wafer abnormality can be detected is lower.

It can be considered that narrowing a range of the normal range current value reduces detection failures of the wafer abnormality. However, if the range of the normal range current value is narrowed, erroneous detection tends to occur easily, inspection of the grinding apparatus, excessive confirmation work for the wafer, and the like increase. As described above, in the configuration using the general grindstone, the fluctuation of the load current is small, which makes it difficult to properly define the normal range current value. Therefore, in the configuration using the general grindstone, as described before, the probability that the wafer abnormality can be detected is lower.

On the other hand, according to the present preferred embodiment, the special grindstone is used in the grinding processing. In this case, according to the foregoing experimental result of the inventors of the present invention, and the like, large change in the load current value occurs, and the wafer abnormality can be detected with a very high probability (90% or more).

In the configuration using the special grindstone, the wear amount of the special grindstone increases, so that increase in cost of the grinding processing is caused. However, if the wafer abnormality can be detected with a very high probability, at that point, countermeasures can be taken so that no wafer abnormality occurs. The countermeasures are, for example, replacement of the grindstone.

This makes it possible to eliminate the occurrence of abnormality in the wafer grinding state in the grinding processing with respect to the subsequent semiconductor wafers W1. Therefore, it is possible to eliminate destruction of the semiconductor wafer associated with the grinding abnormality. As a result, an increase in the overall cost of the grinding processing can be suppressed.

<First Modification>

Hereinafter, the configuration of the first preferred embodiment is also referred to as a "configuration Ct1". In the following description, a configuration of the present modification is also referred to as a "configuration Ctm1.". The configuration Ctm1 is configured such that the determination part 9 performs the determination processing, based on the grinding wear amount. The grinding wear amount is a wear amount of the grindstone 4 generated by performing the grinding processing once. The configuration Ctm1 is applied to the configuration Ct1 (the first preferred embodiment).

The grindstone 4 in the configuration Ctm1 is the special grindstone having the special wear rate. Hereinafter, a thickness of the grindstone 4 before the grinding processing is performed with respect to the semiconductor wafer W1 is also referred to as a "thickness d1$n$" or "d1$n$". In the following description, a thickness of the grindstone 4 immediately after the grinding processing is performed once with respect to the semiconductor wafer W1 is also referred to as a "thickness d1$a$" or "d1$a$". The grinding wear amount corresponds to a value obtained by subtracting the thickness d1$a$ from the thickness d1n. That is, the grinding wear amount corresponds to a value obtained by a formula of d1$n$-d1$a$ (hereinafter also referred to as a "thickness difference value").

In the configuration Ctm1, the thickness measuring part 8 of the wafer grinding apparatus 100 notifies the determination part 9 of the thickness d1$n$ of the grindstone 4 before the grinding processing is performed. Further, the thickness measuring part 8 notifies the determination part 9 of the thickness d1$a$ of the grindstone 4 immediately after the grinding processing is performed once. The determination part 9 calculates the thickness difference value obtained by the fore a of d1$n$-d1$a$ as the grinding wear amount.

When the grinding wear amount is larger than the predetermined normal range wear value, the determination part 9 determines that the wafer grinding state is abnormal (that is, the wafer abnormality has occurred). The normal range wear value includes a plurality of values. The normal range wear value is a value including an error and the like with respect to the wear amount of the grindstone 4 planned to be generated by performing the normal grinding processing once.

Figure 7:
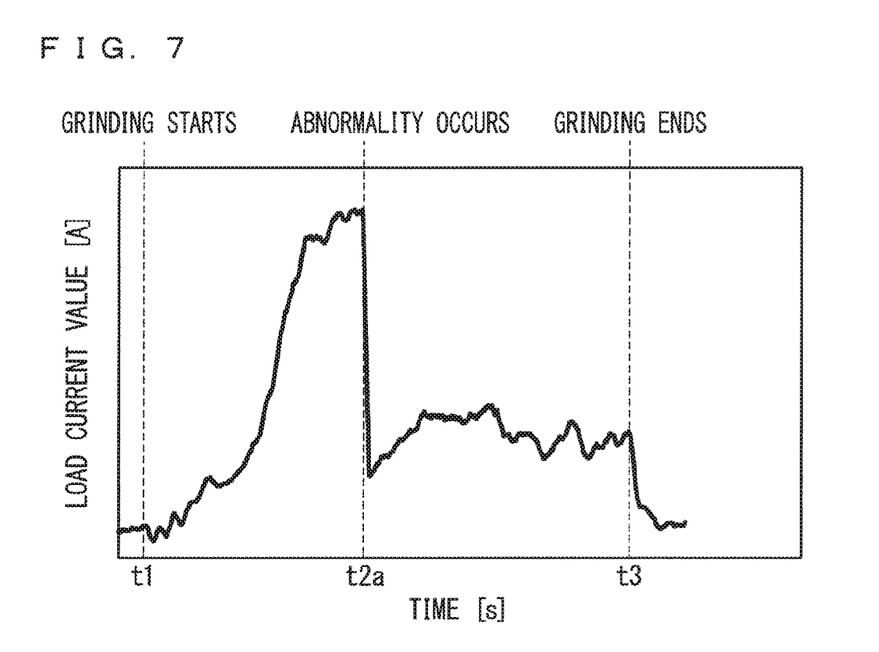
FIG. 7 is a diagram showing an example of the measurement result of the load current value in a case where abnormality occurrence grinding processing is performed, using the special grindstone.

FIG. 7 is a diagram showing an example of a measurement result of the load current value in the case where the abnormality occurrence grinding processing is performed, using the special grindstone. Hereinafter, a time from start of the grinding processing to end of the grinding processing is also referred to as a "grinding required time". In FIG. 7, the water abnormality occurs on the grinding surface at the time t2$a$. Therefore, the grinding required time is longer as compared with the case where the wafer abnormality does not occur.

A reason for the longer grinding required time is as follows. The wear amount of the grindstone 4 increases due to the occurrence of the wafer abnormality. In this case, the reason is that in order to bring the grindstone 4 into contact with the grinding surface of the semiconductor wafer W1, it is necessary to move the spindle Sp1 (grinding unit 10) much to correspond to the increase in the wear amount of the grindstone 4.

Here, it is assumed that the grinding processing with the result of FIG. 7 was performed. In this case, in the configuration Ctm1, after a time t3, that is, after the end of the grinding processing, the determination part 9 calculates the thickness difference value obtained by the formula of d1$n$-d1$a$ as the grinding wear amount. The determination part 9 then performs the determination processing, based on the grinding wear amount. The determination processing is processing for determining whether the wafer grinding state is abnormal or normal.

In this case, the calculated grinding wear amount is larger than the normal range wear value. Therefore, the determination part 9 determines that the wafer grinding state is abnormal (that is, the wafer abnormality has occurred). When it is determined that the wafer abnormality has occurred, the operation of the wafer grinding apparatus 100 is stopped. This can prevent the grinding processing with respect to the subsequent semiconductor wafers W1 from being performed.

As described above, according to the present modification, in the case where the wafer abnormality occurs in the period when the grinding processing using the special grindstone is being performed, the determination part 9 performs the determination processing, based on the grinding wear amount. In this configuration, effects similar to those of the first preferred embodiment can also be obtained.

The above-described grinding wear amount is not limited to the thickness difference value obtained by the formula of d1$n$-d1$a$. For example, the grinding wear amount may be a value obtained by multiplying the thickness difference value by the total area of the grinding use surface of the grindstone 4.

<Second Modification>

Hereinafter, a configuration of the present modification will also be referred to as a "configuration Ctm2". In the configuration Ctm2, the determination part 9 is configured to perform the determination processing, based on the load current (load current value) and the grinding wear amount. The configuration Ctm2 is applied to the configuration Ct1 (the first preferred embodiment).

In the configuration Ctm2, in the grinding period Pd, when the change amount in the load current (load current value) in the unit time is equal to or larger than the abnormality determination threshold value, and the grinding wear amount is larger than the normal range wear value, the determination part 9 determines that the wafer grinding state is abnormal (that is, the wafer abnormality has occurred). A determination method using the load current value performed by the determination part 9 is similar to that in the first preferred embodiment. A determination method using the grinding wear amount performed by the determination part 9 is similar to that in the first modification.

As described above, according to the present modification, by using the two parameters of the load current value and the grinding wear amount, the wafer grinding state can be determined with higher accuracy as compared with the configuration using one parameter.

Further, according to the present modification, the wafer grinding state is determined only by the two parameters of the load current value and the grinding wear amount. Therefore, for example, unlike the conventional configuration using a polishing rate, there is an advantage that it is unnecessary to measure a large amount of data.

It should be noted that, within the scope of the invention, the present invention can freely combine the preferred embodiment and the modifications, and can appropriately modify and omit the preferred embodiment and the modifications.

Further, the present invention may be realized as a wafer grinding method having, as steps, the operation of the characteristic components that the wafer grinding apparatus 100 includes.

While the invention has been shown and described in detail, the foregoing description is in all aspects illustrative and not restrictive. It is therefore understood that numerous modifications and variations can be devised without departing from the scope of the invention.

What is claimed is:

1. A wafer grinding apparatus that performs grinding processing for grinding a semiconductor wafer comprising:
   a spindle;
   a grindstone attached to the spindle; and
   a motor configured to turn the spindle and rotate the grindstone to grind the semiconductor wafer, wherein
   in the grinding processing, when a grinding amount is expressed as Kw, and a wear amount of the grindstone is expressed as Kt, the grinding amount being an amount for grinding the semiconductor wafer with the grindstone, and the wear amount being planned to be generated by performing the grinding processing,
   the grindstone has, as a characteristic, a wear rate expressed by a formula of Kt/Kw,
   the wear rate is 5% or more, and less than 200%,
   the wafer grinding apparatus further comprises a determination part that performs determination processing for determining whether a grinding state with respect to the semiconductor wafer is abnormal or normal, based on a load current of the motor for rotating the grindstone in the grinding processing,
   in a period when the grinding processing is being performed, when a reduction in the load current in a unit time for determining the abnormality is equal to or larger than a threshold value for determining the abnormality, the determination part determines that the grinding state is abnormal.

2. The wafer grinding apparatus according to claim 1, wherein the determination part performs the determination processing, based on the load current and the grinding wear amount.

3. A wafer grinding method performed by a wafer grinding apparatus that performs grinding processing for grinding a semiconductor wafer,
   the wafer grinding apparatus comprising
   a spindle;
   a grindstone attached to the spindle; and
   a motor configured to turn the spindle and rotate the grindstone,
   wherein in the grinding processing, when a grinding amount is expressed as Kw, and a wear amount of the grindstone is expressed as Kt, the grinding amount being an amount for grinding the semiconductor wafer with the grindstone, and the wear amount being planned to be generated by performing the grinding processing,
   the grindstone has, as a characteristic, a wear rate expressed by a formula of Kt/Kw,
   the wear rate is 5% or more, and less than 200%, and
   the wafer grinding method comprises:
     grinding the semiconductor wafer with the grindstone, and
     a determination step of performing determination processing for determining whether a grinding state with respect to the semiconductor wafer is abnormal or normal, based on-a load current of the motor for rotating the grindstone in the grinding processing, and
   in the determination step, in a period when the grinding processing is being performed, when a reduction in the load current in a unit time for determining the abnormality is equal to or larger than a threshold value for determining the abnormality, the grinding state is determined to be abnormal.

4. The wafer grinding method according to claim 3, wherein in the determination step, the determination processing is performed, based on the load current and the grinding wear amount.

* * * * *